United States Patent [19]
Hall et al.

[11] Patent Number: 5,150,710
[45] Date of Patent: Sep. 29, 1992

[54] VARIABLE POSITION SURFACE COIL STABILIZER FOR MAGNETIC RESONANCE IMAGING

[75] Inventors: Bradford D. Hall, Fairless Hills; Steven B. Krupnick, Philadelphia, both of Pa.

[73] Assignee: Webb Research II, Inc., Philadelphia, Pa.

[21] Appl. No.: 483,244

[22] Filed: Feb. 22, 1990

Related U.S. Application Data

[63] Continuation-in-part of Ser. No. 342,232, Aug. 21, 1989, abandoned.

[51] Int. Cl.⁵ ............................................. A61B 5/055
[52] U.S. Cl. .................................. 128/653.5; 324/318
[58] Field of Search ...................... 128/653.5, 70–74, 128/20; 324/307, 309, 318–320, 322; 248/285, 279, 160, 104, 181; 269/328

[56] References Cited

U.S. PATENT DOCUMENTS

| | | | |
|---|---|---|---|
| 1,279,803 | 9/1918 | Watson | 248/160 |
| 1,989,437 | 1/1935 | Weisz | 248/160 |
| 2,110,037 | 3/1938 | Rosa | 248/104 |
| 4,793,356 | 12/1988 | Misic et al. | 324/322 |
| 4,887,038 | 12/1989 | Votruba et al. | 324/318 |
| 4,891,596 | 1/1990 | Mitomi | 324/318 |
| 4,903,703 | 2/1990 | Igarashi et al. | 128/653 A |
| 4,923,295 | 5/1990 | Sireul et al. | 128/653 A |
| 4,975,644 | 12/1990 | Fox | 324/322 |
| 5,059,906 | 10/1991 | Yamanaka | 324/318 |

FOREIGN PATENT DOCUMENTS

| | | | |
|---|---|---|---|
| 854100 | 7/1949 | Fed. Rep. of Germany | 248/160 |
| 3628035 | 2/1988 | Fed. Rep. of Germany | 324/318 |
| 3822185 | 1/1989 | Fed. Rep. of Germany | 324/318 |
| 1278094 | 10/1960 | France | 248/104 |

*Primary Examiner*—Lee S. Cohen
*Assistant Examiner*—K. M. Pfaffle
*Attorney, Agent, or Firm*—Caesar, Rivise, Bernstein, Cohen & Pokotilow, Ltd.

[57] ABSTRACT

In a nuclear magnetic resonance imaging system, a receive-only RF surface coil is fixedly supported on a non-metallic portable base by a non-metallic flexible support which permits the coil to be translated along any one of three orthogonal directions and to be rotated about any one of three orthogonal axes with respect to the base. The coil is therefore quickly movable to any position and orientation adjacent a patient being scanned in the magnetic resonance imaging system, and is immovably supported in the selected position and orientation during the scanning process. The coil may therefore be quickly and easily placed as close as possible to any region of interest of the patient's body without touching it, thereby optimizing the quality of the images obtained while avoiding undesirable image artifacts normally caused by movement of the coil with the patient's body motion. In one embodiment of the invention, a modular segmented joint assembly mounted on the base is connected to the surface coil through a ball jointed head. The surface coil is mounted in the head by hook and loop fasteners. The interior of the segmented joint assembly may be filled with a friction-increasing substance such as powder to increase stiffness of the assembly. Another segmented joint assembly supports a multi-mirror assembly on the base, allowing the patient to see non-inverted images outside of the MRI enclosure.

1 Claim, 8 Drawing Sheets

FIG. 6
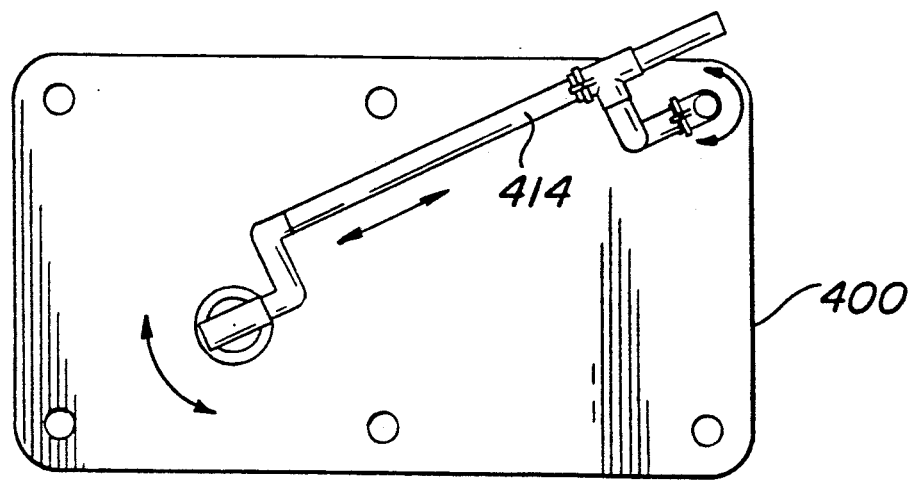
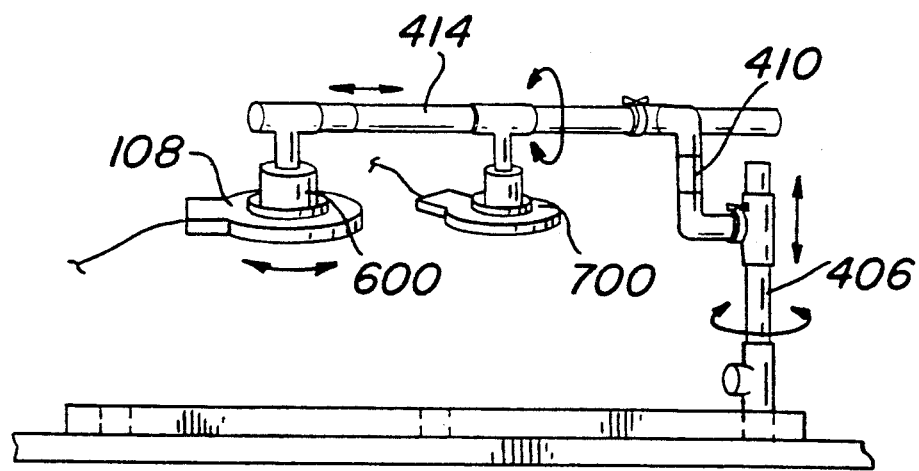
FIG. 7

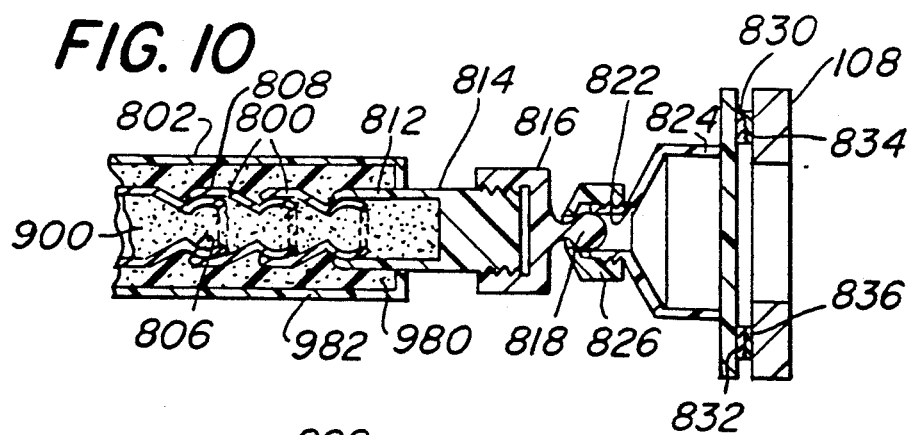
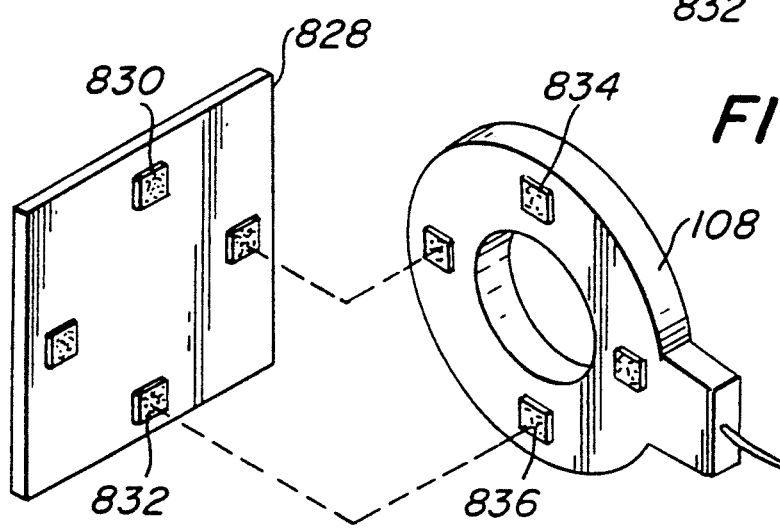
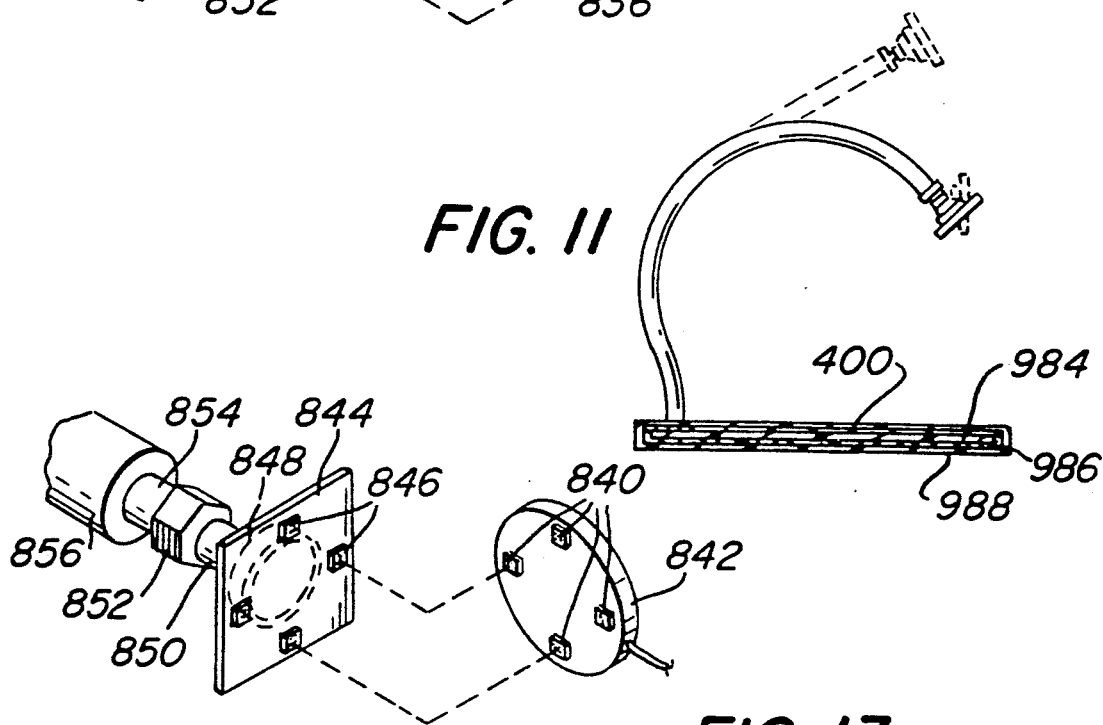

VARIABLE POSITION SURFACE COIL STABILIZER FOR MAGNETIC RESONANCE IMAGING

CROSS-REFERENCE TO RELATED APPLICATIONS

This application is a continuation-in-part patent application of U.S. patent application Ser. No. 07/342,232 filed Apr. 21, 1989, now abandoned by Bradford D. Hall of the same title as the present application.

BACKGROUND OF THE INVENTION

1. Field of the Invention

The invention lies in the field of nuclear magnetic resonance imaging (MRI) technology and particularly relates to the use of non-metallic support apparatus for surface coils in connection with such technology.

2. Description of Related Art

Nuclear magnetic resonance imaging is a recently developed art useful in the field of medical diagnosis, and is described for example in Valk et al., *Basic Principles of Nuclear Magnetic Resonance Imaging*, 1985, published by Elsevier Science Publishing Company, Inc., 52 Vanderbilt Avenue, New York, NY 10017 and numerous other publications. The basic technique requires a permanent magnetic field having a gradient and an RF magnetic field. A body to be imaged is scanned by switching the magnetic fields in both space and time using the well-known spin-echo effect. While the same radio frequency (RF) coil has been used to both transmit the RF magnetic field and to receive the spin-echo return signal, an improvement in image quality of small body areas has been achieved with the recent introduction of small surface coils. The surface coils receive the return signal instead of the RF coils. See for example pages 106 through 108 of the above-referenced text by Valk et al., and Zlatin et al., "Magnetic Resonance Imaging of the Shoulder", *Magnetic Resonance Quarterly*, Volume 5, No. 1, pp. 3-22, January, 1989. As illustrated in the foregoing publication by Zlatin et al., a doughnut shaped surface coil is placed close to the body portion to be imaged. The coil is connected to an MRI system which performs the imaging processing and produces the images.

One MRI system currently in use is the 0.5 Tesla General Electric Magnetic Resonance Imaging System (also known as the 0.5 T GE MRI System) available from the General Electric Company, Fairfield, Connecticut, USA. A more robust MRI system now in use is the 1.5 Tesla General Electric Magnetic Resonance Imaging System (also known as the 1.5 T GE MRI System). The quality of the images obtained using MRI determines their usefulness in making a diagnosis.

Image quality is directly affected by placement of the surface coil. The coil must be held perfectly still and close to the body portion which is to be imaged. Moreover, the surface coil must be held at a particular angle with respect to the body and with respect to the MRI system in order to accomodate a particular angle of view which is required in each particular case. Prior to the introduction of the surface coil, clinical applications of MRI have been mostly for imaging the head or the spine, since the head and spine do not generally require an oblique angle of view with respect to the patient's body or with respect to the MRI system.

Applying MRI using conventional techniques to other body parts, such as the shoulder for example, results in lower quality images which are not as useful for diagnosis. Nevertheless, an interest is now developing in applying MRI to the shoulder, as evidenced by the above-cited publication by Zlatin et al. The Zlatin et al. publication is exemplary of one type of conventional technique for placing and supporting the surface coil in obtaining shoulder images with MRI. The apparatus illustrated in the Zlatin et al. publication for supporting the surface coils is narrowly and specifically designed for use in obtaining shoulder images or the like. The patient is forced to rest the shoulder of interest on top of the bottom surface coil, while a top surface coil is held over the same shoulder. In many cases, holding the patient in the supine position illustrated in the Zlatin et al. publication while resting the shoulder on one of the surface coils may be painful, particularly if the shoulder is injured, and the whole procedure may be somewhat impractical or excessively time consuming in certain cases. Moreover, it would seem a different apparatus for holding the surface coil would have to be designed for obtaining MRI images of body parts other than the shoulder, particularly if unique viewing angles are required.

Another example of a support apparatus for the surface coil having narrow applicability—for obtaining MRI images of the head only—is illustrated in a sheet entitled "Application Tips" distributed by General Electric Company in connection with its 0.5 T GE MRI System mentioned above, in which a technique is described for supporting the surface coil on a head rest.

There are certain restrictions in accommodating the patient's comfort while taking MRI images. For example, using a single surface coil to obtain shoulder images produces poorer quality images, particularly if the surface coil is located behind the shoulder. This is probably due to the larger amount of tissue near the back side of the shoulder. In view of this and various practical limitations, it has not seemed possible to improve the efficiency or to reduce patient discomfort in clinical MRI applications. More importantly, taking MRI images of other body portions (for example, hips, internal auditory canals, orbits, tempro mandibular joints, shoulders, etc.) involves significant inefficiencies. This is because in many cases a different support apparatus for the surface coil must be obtained or designed and then carefully installed with the patient in position. The different support apparatus must be specifically adapted to obtaining MRI images of the particular body portion of interest. Such a change in surface coil support apparatus represents a serious delay in a typical MRI clinic and inconvenience or discomfort for the patient.

In summary, obtaining MRI images requires an exacting effort in positioning the patient in the optimum position with respect to the MRI apparatus and then steadying a surface coil at just the right location and orientation with respect to the patient's shoulder or foot or hip, etc. Accordingly, most current clinical use is generally directed to imaging the head and spine or other "symmetrical" body part, since it does not seem possible to consistently obtain high quality MRI images of other body portions in the typical everyday clinical setting. Moreover, current practice must subordinate the patient's comfort to the exacting requirements of obtaining an MRI image.

Accordingly, there exists a great need to enable the typical MRI clinic to obtain MRI images of any and all body portions with the same efficiency while meeting the exacting requirements for obtaining high quality MRI images and without subordinating the patient's comfort to the degree previously required.

SUMMARY OF THE INVENTION

The invention is a positionable mount for a surface coil connected to an MRI system. The positionable mount can be placed anywhere along the length of a patient's body in the MRI system. It permits the surface coil to be translated along any one or all of three orthogonal axes and to be rotated about any one or all of the three axes while being supported by the positionable mount. Movement of the surface coil in the positionable mount is thus characterized by six degrees of freedom. As a result, the surface coil may be placed near or touching any portion of a patient's body at any orientation with respect to the body or with respect to the MRI system. After the surface coil position and orientation on the mount have been adjusted, the mount firmly holds the surface coil in place during MRI scanning.

Preferably, the surface coil is connected to the MRI system by a cable having sufficient length to permit the surface coil to be moved to any position along a patient's body.

In order to use the invention, a determination is first made as to which part of the patient's body is to be imaged. Next, the positionable mount holding a surface coil is stably positioned adjacent that part of the patient's body. The surface coil is quickly translated and rotated in the mount with respect to the patient until the optimum position and orientation for a particular MRI image are obtained. MRI scanning then commences.

One advantage of the invention is that no substitution of different apparatus is required to make MRI images of different portions of the body, which significantly increases the efficiency in a typical MRI clinic. Another advantage is that the surface coil can be fixably positioned much closer to any location on the patient's body at the optimum orientation regardless of the orientation or position of the patient and without requiring the patient's body to support or rest upon the surface coil. This significantly enhances the possibilities for accommodating the patient's particular symptoms of discomfort during MRI scanning. It also reduces undesirable image artifacts caused by breathing motion of the patient (moving the surface coil during scanning). Most importantly, the closer proximity of the surface coil enhances the quality of the MRI image.

It is a discovery of the invention that the poor quality of MRI images obtained using prior techniques of such difficult portions of the body as the shoulder, neck, prostate, etc., has been due at least in part to the inability of conventional techniques to stably support the surface coil extremely close to the portion of the body to be imaged. Alternatively, such prior techniques held the surface coil close to the body by holding it against the body, giving rise to an unacceptable loss of image quality caused by movement of the patient's body. Preferably, in the typical MRI clinical environment, the surface coil should not rest against the patient's body, but should nevertheless be very close to it.

Pursuant to the foregoing advantages, for the first time it is possible to consistently obtain images of the shoulder, for example, of quality sufficient for medical diagnosis, something which was previously found impossible prior to the invention.

One embodiment of the invention may be constructed with PVC (poly-vinyl chloride) piping and fittings. This embodiment consists of a movable rectangular plastic base which rests under the patient's mattress in the MRI system. A pipe snugly fits into one of several holes in the rectangular base and extends vertically upward. This pipe may be rotated with respect to the base. A "T" fitting snugly fits around the vertically extending pipe and is rotatable as well as translatable (up and down) on the vertically extending pipe. A right-angled pipe horizontally joins the "T" fitting at one end while its other end extends vertically upward. This latter end of the right angled pipe joins a second "T" section. A main pipe snugly fits inside the second "T" section horizontally and is rotatable and translatable within the second "T" section. One end of the main pipe supports a surface coil coupler. The coupler is a head pivotally mounted on a ball joint, the head being round and fitting snugly within the inner diameter of the surface coil.

In the preferred embodiment, the invention is constructed of plastic tubing. Furthermore, the cable connecting the surface coil to the MRI system is so long that the rectangular plastic base may be positioned anywhere along the patient's body or under the mattress.

The rectangular base is positioned under the mattress while the vertically and horizontally extending pipes are quickly rotated and/or translated within their fittings until the coupler is optimally positioned, the surface coil being movable about the ball joint of the coupler until it is located in the closest possible proximity to the body portion of interest without resting on it. All of this takes place in a negligible amount of time, compared with set-up times experienced with conventional surface coil support techniques. A feature of the various embodiments of the invention is that the surface coil is stably held in position even while it is quickly movable with many degrees of freedom. In one embodiment of the invention, the fit between the various pipes and their fittings is sufficiently snug so that, once rotation or translation ceases, the position of the surface coil is held, thus further reducing set-up time.

In one embodiment of the invention, a modular segmented joint assembly mounted on the base supports the surface coil. As an added feature, a modular segmented joint assembly connected to the base supports a multimirror assembly which permits the patient to view right-side-up images during the MRI scanning process, to decrease claustrophobia and thereby decrease poor MRI imaging results due to patient movement. Individual joints in the modular segmented joint assembly may be popped in or out to change the length of the assembly as desired during manufacturing for example. For particularly long assemblies or where a particularly heavy surface coil is to be supported, the stiffness of the modular segmented joint assembly is increased in accordance with the invention by filling the tubular interior of the segmented joint assembly with a friction-increasing substance such as a powder (e.g., as barium salt). The surface coil is attached to the end of the segmented joint assembly preferably by a ball and joint head assembly.

BRIEF DESCRIPTION OF THE DRAWINGS

Preferred embodiments of the invention are described in detail by reference to the accompanying drawings, of which:

FIG. 6 is a top view of an alternative embodiment of the invention;

FIG. 7 is a side view of the embodiment of FIG. 6;

FIG. 10 is a cross-sectional side view of the flexible arm assembly of the embodiment of FIG. 8;

FIG. 11 is a diagram depicting how the arm assembly of FIG. 8 may be flexed;

FIG. 12 is a diagram of apparatus for removably attaching the R.F. surface coil to the flexible arm of FIG. 8;

FIG. 13 is a diagram of apparatus for removably attaching a smaller R.F. surface coil to the flexible arm of FIG. 8;

DETAILED DESCRIPTION OF THE PREFERRED EMBODIMENTS OF THE INVENTION

Figure 1:
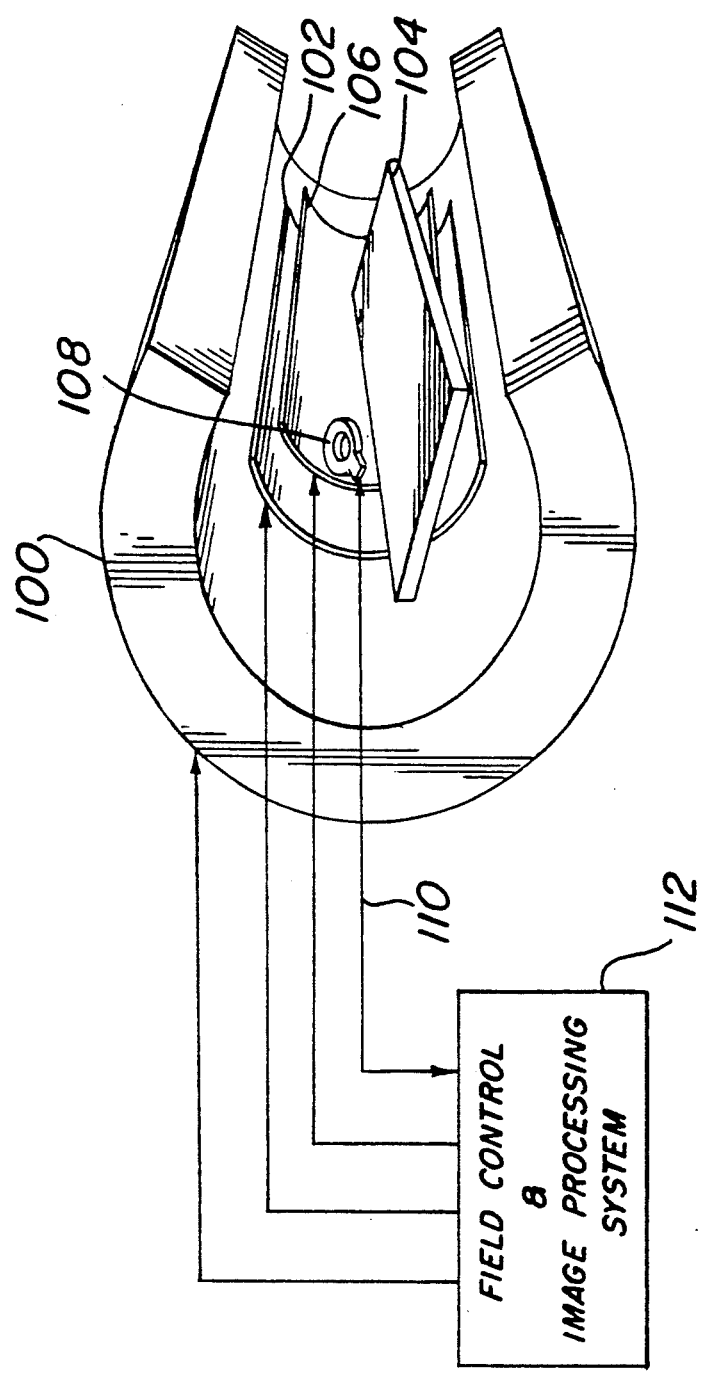
FIG. 1 illustrates magnetic resonance imaging apparatus of the type well-known in the art.

A typical magnetic resonance imaging system is illustrated in FIG. 1. A magnet 100 and gradient coils 102 generate a magnetic field surrounding a table 104 on which a patient or subject reposes. Radio frequency (RF) coils 106 generate a radio frequency magnetic field characterized by a frequency determined in accordance with well-known principles of magnetic resonance imaging. The nuclear magnetic resonance effect induced by the magnet 100 and coils 102, 106 in the subject is sensed by a surface coil 108 connected through a cable 110 to a field control and image processing system 112. The system 112 controls the magnet 100, the gradient coils 102 and the RF coils 106 as required to produce the well-known spin-echo effect of magnetic resonance imaging. The surface coil 108 responds to the spin-echo effect to produce a signal from which the field control and image processing system 112 constructs an image. Briefly, the subject is spatially scanned using the spin-echo effect by recording over time the output of the surface coil 108 while the nuclear spin states of neighboring volume elements in the patient's body viewed by the surface coil 108 recover from a carefully induced pulse or change in the magnetic field. The magnitude and direction of this induced field change as well as the orientation of the surface coil 108 and the patient must be carefully selected in accordance with well-known practice.

Figure 2A:
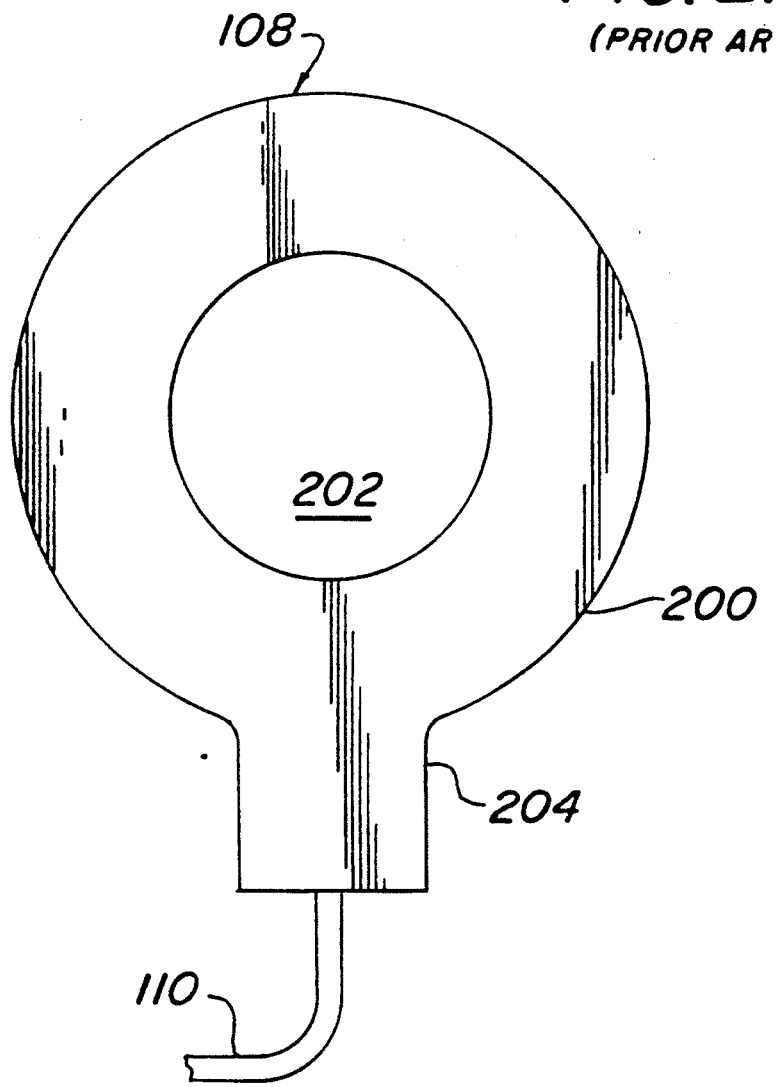
FIGS. 2A and 2B are top and end views respectively of a surface coil of the type well-known in the art used in the apparatus of FIG. 1.
Figure 2B:
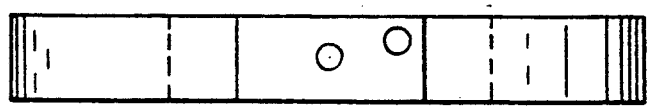

The appearance of a typical surface coil 108 currently in use is illustrated in top and side views in FIGS. 2A and 2B, respectively. The surface coil 108 includes a circular portion 200 surrounding an opening 202 and a stem 204 attached to the cable 110 from the system 112.

The problem is how to hold the surface coil 108 perfectly motionless at the optimum orientation as close to the portion of interest of the patient's body as possible without touching the body. More particularly, the problem is how to do this for different portions of the body with different orientations of the surface coil 108 without having to change the apparatus used to support the surface coil 108 near the patient.

Figure 3:
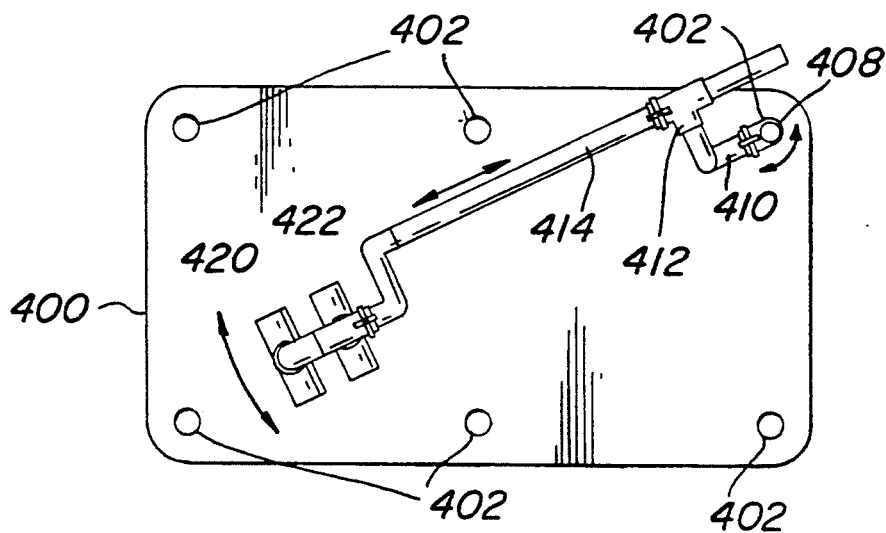
FIG. 3 is a top view of one embodiment of the surface coil support apparatus of the invention.
Figure 4:
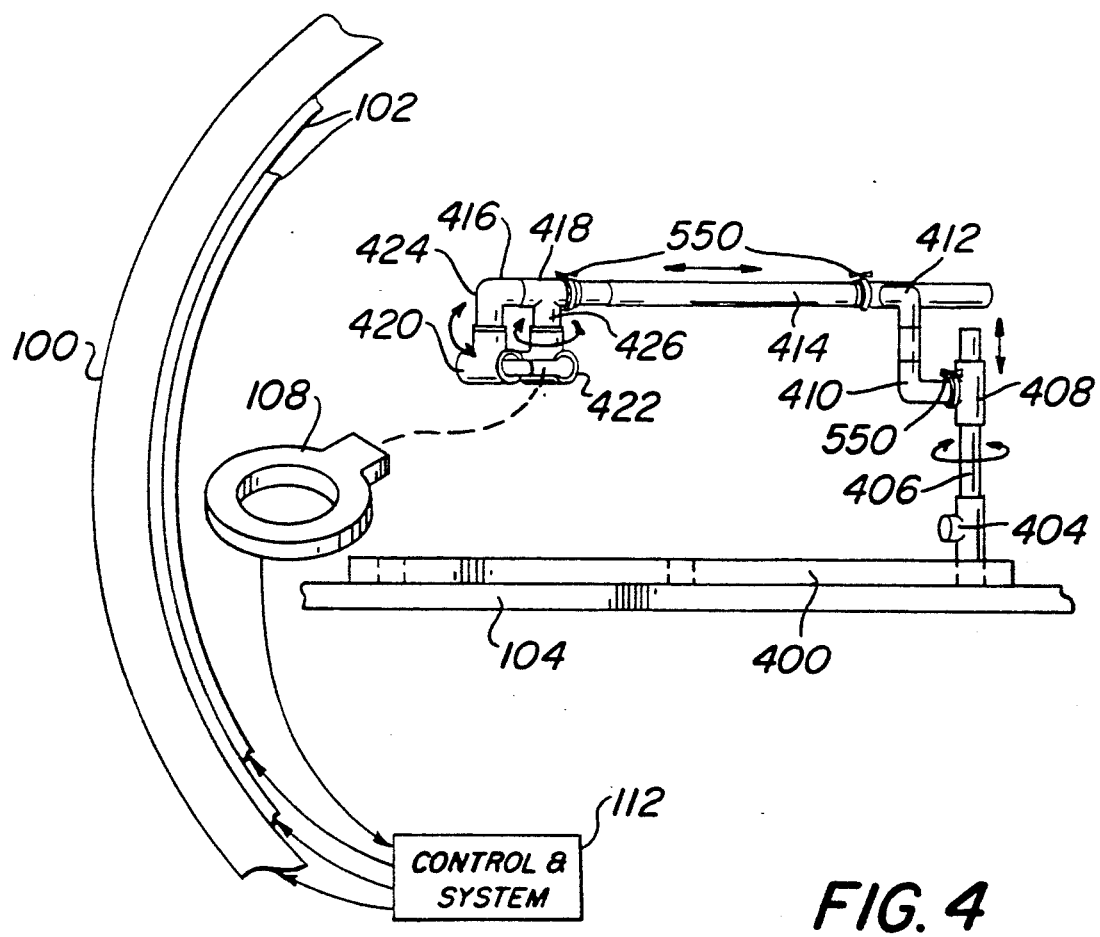
FIG. 4 is a side view of the surface coil support apparatus of FIG. 3.

One embodiment of the surface coil support apparatus of the invention which solves the foregoing problem is illustrated in FIGS. 3 and 4. A padded rectangular plastic base 400 has a plurality of holes 402 extending through it. The base 400 is preferably slid under a mattress supporting the patient over the table of FIG. 1. A hollow cylindrical plastic base fitting 404 rests axially inside any one of the holes 402. The bottom end of a vertically extending cylindrical plastic stand strut 406 fits tightly into the hollow base fitting 404 while the top end of the stand strut 406 fits tightly inside a hollow T fitting 408. A horizontally extending end of a right-angle strut 410 fits tightly inside the T fitting 408, while a vertically extending end of the right-angle strut 410 fits tightly inside another T fitting 412. A long horizontally extending cylindrical arm strut 414 fits through the other T fitting 412. A right-angle strut 416 fits tightly inside a hollow end fitting 418 which in turn is connected to one end of the arm strut 414.

Figure 5:
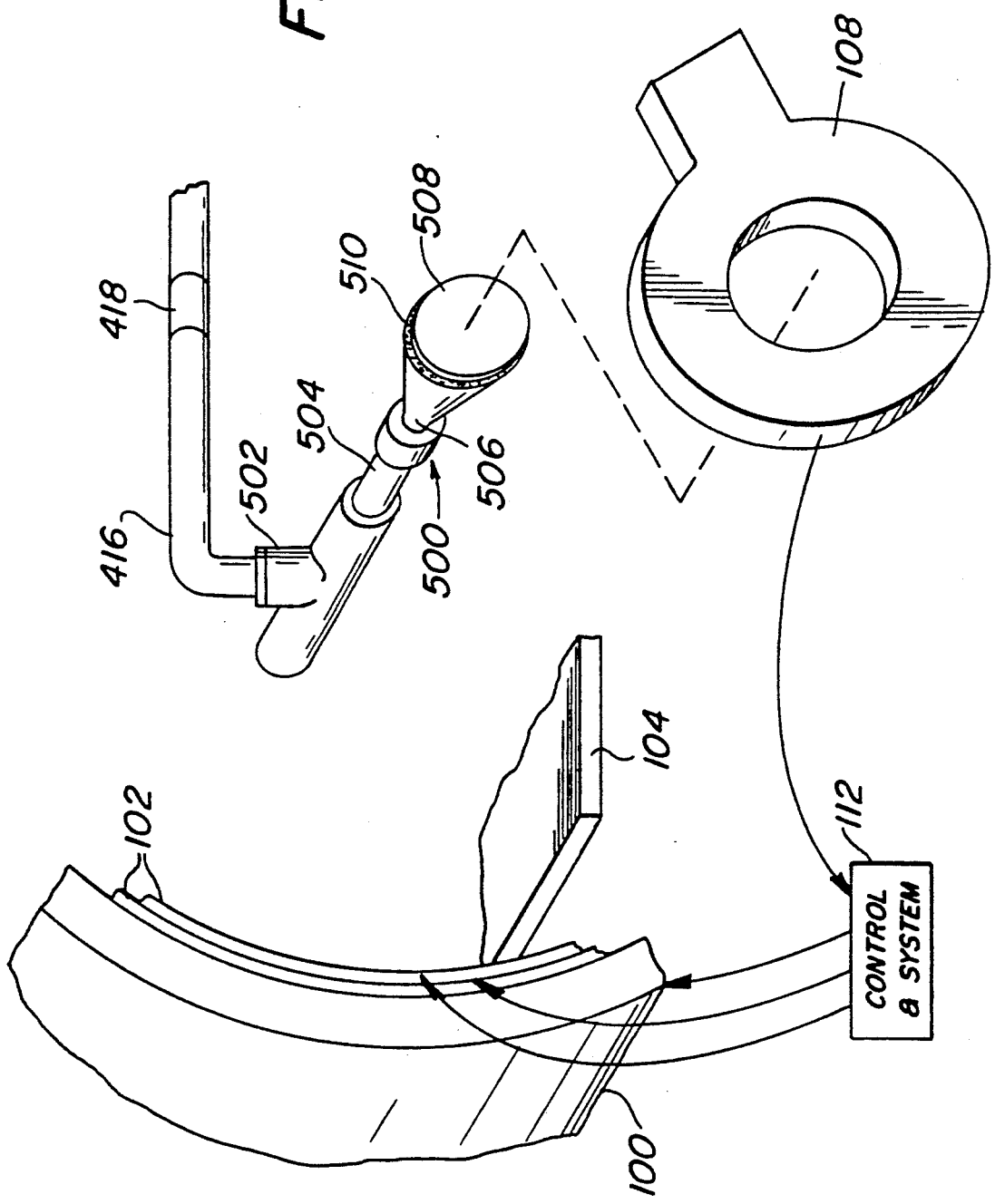
FIG. 5 illustrates the preferred embodiment of a ball jointed coupler by which the apparatus of FIG. 4 holds the surface coil of FIGS. 2A and 2B.

In an alternative embodiment of the invention, and as illustrated in FIGS. 3 and 4, a pair of hemispherical hand pieces 420, 422 may fit tightly onto downwardly extending strut sections 424, 426 on the right-angle strut 416 and the fitting 418 respectively, the pair of hemispherical hand pieces 420, 422 facing one another with a fixed space S between them into which the stem 204 of the surface coil 108 of FIG. 2A tightly fits. However, in the preferred embodiment of the invention, and as illustrated in FIG. 5, the right-angle strut 416 instead supports an articulating plastic head assembly 500 through a T fitting 502. The head assembly 500 includes a cylindrical strut section 504 inserted tightly into the fitting 502 and a ball joint section 506 supporting the head 508 of the head assembly 500. By virtue of the ball joint, the head 508 is pivotable with respect to the strut section 504. The ball joint section 506 includes a ball and housing similar to that of a plastic shower head, for example, and is characterized by a tight fit between the ball and the housing, so that the head 508 strongly maintains its position once it has been rotated about the ball joint section to a new position. The head 508 has an outer circumferential surface supporting a deformable gasket ring 510. The diameter of the head 508 is such that the head 508 and the ring 510 tightly fit inside the opening 202 of the surface coil 108 of FIG. 2A.

Each of the struts 406, 410, 414 and 416 is rotatable about its cylindrical axis within each of the respective fittings 404, 408, 412, 418 and 502. Furthermore, the arm strut 414 is slidable along its cylindrical axis within the fitting 412 while the fitting 408 is slidable along the stand strut 406. As a result, surface coil can be both rotated and translated about or along any one of any three orthogonal axes. Moreover, because the plastic struts and fittings are elastically deformable and fit tightly together, such rotation or translation may be performed quickly and, as soon as the rotating or translating force is removed, the surface coil is firmly and stably held in its new position. Because the invention supports the surface coil 108 adjacent any part of the body, the surface coil cable 110 is preferably of sufficient length to allow the surface coil 108 to be moved to any part of the patient's body or to any location along the length of the table of FIG. 1.

Because the rotation or translation of the struts within the various fittings may be redundant, it may be desirable to glue some of the struts in some of the fittings, so that a particular rotation or translation is performed by the movement of one of the struts with respect to a particular one of the fittings. Also, movement of a strut within a fitting may be temporarily prevented using removable tightenable clasps 550 which fit around the circumference of individual fittings, as illustrated in FIG. 4, and compress the fittings around the struts.

FIGS. 6 and 7 illustrate top and side views, respectively, of another alternative embodiment of the invention. This alternative embodiment is similar to the embodiment of FIG. 5, except that a head 600 which tightly fits through the opening 202 of surface coil 108 is not connected through a ball joint assembly.

Other possible alternative embodiments of the invention may include, for example, supporting the surface coil at one end of an integrally formed flexible elastic rod, attached to the base at its other end, which can be twisted and bent without the use of articulating joints. In another embodiment, the apparatus of the invention may support more than one surface coil. As merely one of many possible examples, FIG. 7 illustrates a second surface coil 700 supported in the same manner as the first surface coil 108 from the same horizontal strut 414.

The embodiments of FIGS. 3-7 may be constructed using 0.75" PVC pipes and fittings, although plastic tubing is preferable. The result has been that, using the invention, it is possible to consistently obtain MRI images of patients' shoulders, for example, of sufficient quality to be accepted by medical doctors for diagnosis. Without the invention it is difficult if not impossible to consistently achieve the foregoing in a typical clinical setting.

Figure 8:
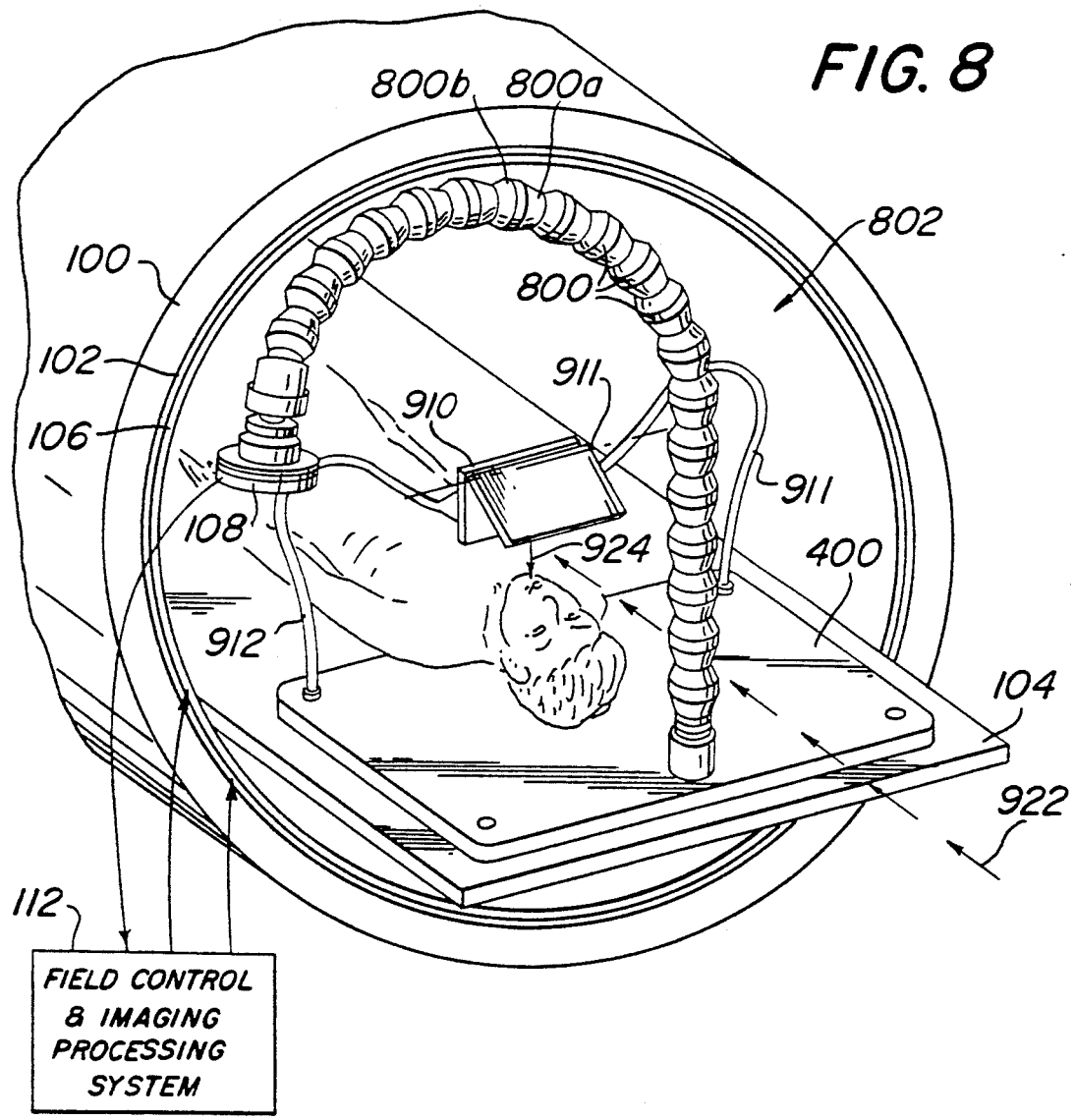
FIG. 8 is a perspective view of a preferred embodiment of the invention employing a flexible arm assembly comprising modular multi-segmented tubular joints.
Figure 9:
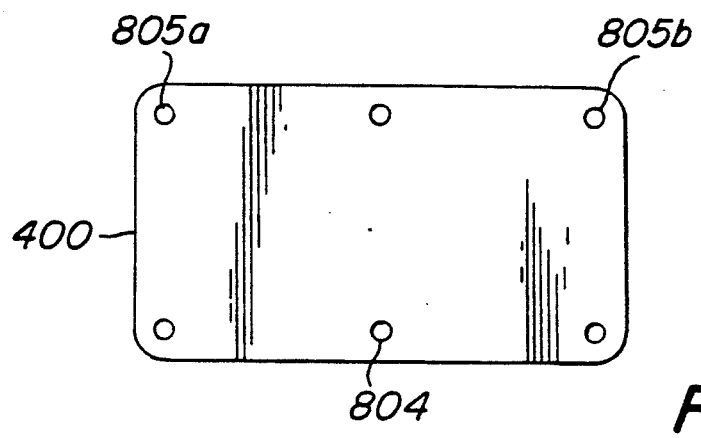
FIG. 9 is a top view of a portable base used in the embodiment of FIG. 8.

Another preferred embodiment of the invention illustrated in FIG. 8 employs modular segmented joints 800 assembled in a flexible snake-like arm 802. One end of the arm is inserted tightly into a hole 804 of the base 400 (FIG. 9). Referring to the cross-sectional view of FIG. 10, the arm 802 comprises a plurality of modular segmented joints 800 joined end-to-end. Each joint 800 is an elastically deformable tube comprising a ball 806 and a hollow skirt 808. The ball 806 of each joint 800 is popped into the skirt 808 of the next joint, and so on. The skirt 808 fits tightly around the ball 806 to permit the ball 806 to rotate within the skirt 808 with the application of a force, and to arrest such rotation upon removal of the force. The segmented joints 800 are modular in that each ball 806 may be withdrawn or "popped out" from the interior of the neighboring skirt 808 and reinserted therein or "popped in", permitting quick length adjustment during manufacturing. For this purpose, the open end 810 of each hollow skirt 808 curves inwardly as shown to a radius slightly smaller than the radius of the ball 806 to be inserted into it. The structure of such segmented joints 800 is used in the prior art as flexible hose systems for air, vacuum or liquid. Such flexible hoses are sold by Cedarberg Industries, Inc., Minneapolis, Minnesota under the trademark SNAP-LOCK SYSTEMS and by Lockwood Products Inc., Lake Oswego, Oregon under the registered trademark LOC-LINE. Referring to FIG. 10, the hollow skirt 812 of a threaded adapter 814 holds the last ball 806 and is threadably engaged with a female end 816 having a neck 818 and a ball 820 integrally formed therewith. The ball 820 is held inside the externally threaded hollow skirt 822 of a head 824 by a threaded nut 826. The head 824 is bonded by an adhesive to a plate 828 having fasteners 830, 832 bonded by an adhesive to the outer surface thereof. The plate is formed of lightweight material such as hardened plastic of the type sold under the trademark PLEXIGLASS. The surface coil 108 has matching fasteners 834, 836 bonded by an adhesive to its inner face engaging the fasteners 830, 832 on the plate 828. Preferably, the fasteners 830, 832, 834 and 836 are of the type known as hook and loop and are sold under the trademark VELCRO. FIG. 11 illustrates how the pivoting of the various balls 806 within the various skirts 808 permits the arm 802 to flex between the solid line and dashed line positions, for example. FIG. 11 also illustrates how the pivoting of the ball 818 within the skirt 822 of the head 824 permits the surface coil 108 to articulate between the solid line and dashed line positions indicated.

FIG. 12 illustrates the placement of the hook and loop fasteners 830 and 832 on the plate 828 and the hook and loop fasteners 834 and 836 on the surface coil 108 in registration with the fasteners 830 and 832. FIG. 13 illustrates the placement of hook and loop fasteners 840 on a surface coil 842 which is smaller than the surface coil 108. A matching plate 844 smaller than the plate 828 has hook and loop fasteners 846 bonded to its face in registration with the fasteners 840 on the small surface coil 842. A head 848 is bonded to the plate 844 in the same manner that the head 824 is bonded to the plate 828 in FIG. 10. The head 848 is smaller than the head 824 in order to fit with the smaller plate 844. The smaller head 848 has an externally threaded hollow skirt 850 which, like the skirt 822 of the head 824 of FIG. 10, receives a ball (not visible in FIG. 13) smaller than the ball 818 of FIG. 10 and held in place by an internally threaded nut 850 like the nut 826 of Figure which is not visible in FIG. 13 is integrally formed with a neck 854 and an internally threaded member 856 which can be threaded onto the male threaded portion of the fitting 814 of FIG. 10 in place of the ball and joint assembly 816, 818, 822, 824 and 826 of FIG. 10. The invention permits quick change-over between surface coils of different sizes by simply unscrewing the adapter 814 from the ball joint assembly 816, 818, 822, 824 and 826 of Figure and screwing on the ball joint assembly 856, 854, 852, 850 and 848. The ball joint and head assemblies discussed here may be formed from a standard PVC shower head by truncating the head.

In the prior art, use of the assembly of modular segmented joints 800 of FIG. 8 as the support arm 800 is not known and therefore such assemblies, while flexible, are not necessarily as stiff as might be desired in some cases. This may be particularly true if the surface coil 108 is very heavy. It is a discovery of the invention that stiffness of the arm 802 may be increased by filling the hollow interior of the assembly of segmented joints 800 with a fine powder 900 shown in FIG. 10, such as a barium salt. This feature of the invention is particularly desirable if either the arm 802 is very long or if the surface coil 108 is very heavy.

Figure 14:
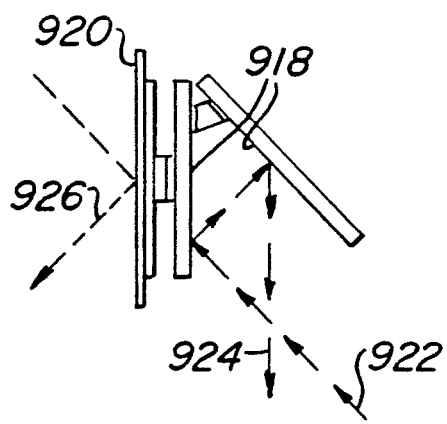
FIG. 14 is a side view of the mirror assembly in the embodiment of FIG. 8.
Figure 15:
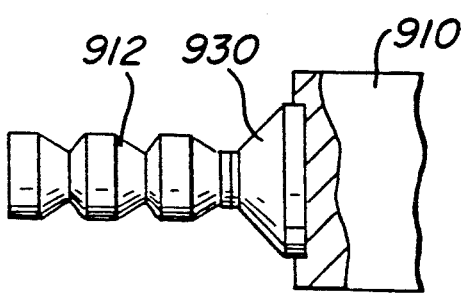
FIG. 15 is a partial front view of the mirror assembly of FIG. 8.

It is known that the use of eye wear with a mirror device enabling the patient to see outside of the MRI apparatus during scanning calms the patient and decreases the incidence of poor MRI scan results due to patient movement caused by nervousness or claustrophobia. Such eye wear is sold under the trademark MOS III by Sherman OPHTHALMIC SUPPLIES, Brea, California. However, this requires the patient to wear the device, which may not be particularly comfortable or fit well. This problem is solved in the present invention by the use of a mirror system illustrated in FIG. 8. The mirror system includes a mirror assembly 910 supported on a pair of multiple segmented joint assemblies or mirror supporting arms 912, 914 attached to the base 400 by insertion in the holes 805a and 805b respectively shown in FIG. 9. The mirror supporting arms 912, 914 are of the same type of multiple segment joint assembly as the arm 802 illustrated in FIG. 8 and FIG. 10. This allows the mirror assembly 910 to be easily and quickly adjusted to the correct orientation permitting the patient to see out of the MRI apparatus. The mirror assembly 910 is illustrated in FIG. 14 and comprises three mirrors 916, 918, 920. The mirrors 916 and 918 are positioned as shown in FIG. 8 so that light 922 from above the patient is reflected to a path 924 toward the patient's eyes. The bounce reflection of the light 922 from the mirror 916 to the mirror 918 enables the patient to view images above his head in a "right-side-up" orientation. Alternatively, the mirror assembly 910 may be rotated about its axis 911 (shown in FIG. 8) by flexing the mirror support arms 912 and 914 to permit the patient to view light 926 from below his feet reflected from the mirror 920 to his eyes. In this case, use of the single mirror 920 enables the patient to view the image in a "right-side-up" orientation. FIG. 15 illustrates how the mirror support arm 912 is fastened to one side of the mirror assembly 910 by a flair connector 930 threadably attached to one end of the arm 912 and bonded to an edge 910a of the mirror assembly 910. The flair connector is sold as a "flair nozzle" by Lockwood Products Inc., Lake Oswego, Oregon. The advantage of the combination of the segmented joint arms 912, 914 and the mirror assembly 910 is that the patient need not wear unfamiliar eye wear devices and the viewing device of the invention is easily adjusted for each individual patient.

Figure 16:
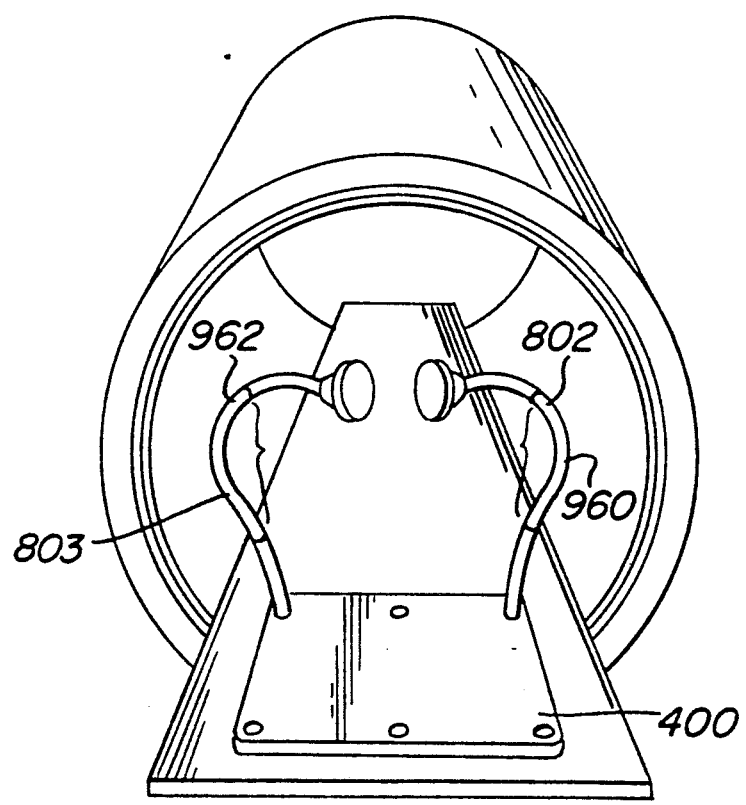
FIG. 16 is a perspective view of a variation of the embodiment of FIG. 8 in which a pair of surface coils are mounted on a pair of flexible arms.

The invention permits the simultaneous support of two surface coils, such as the coils 108 and 842 shown in FIG. 16, by two segmented joint assembly arms 802 and 03, mounted in the holes 805a and 805b, respectively, of the base 400 (FIG. 9). The arms 802 and 803 of FIG. 16 are of the same type as the arm 802 of FIG. 8.

FIG. 16 also indicates how lengths of the arms 802, 803 may be quickly changed. In the embodiment of FIG. 16, the arms 802 and 803 have been considerably lengthened with respect to the embodiment of FIG. 8 to enable imaging of a lower portion of the patient, such as a leg for example. This lengthening merely requires the disengagement of the joints 800a and 800b which are connected together in FIG. 8 by "popping-out" the ball of the joint 800a from the skirt of the joint 800b. Then an additional segmented joint assembly 960 (of the same type as the segmented joint arm 802 of FIG. 8) is connected between the disengaged segmented joints 800a and 800b. A similar operation is carried out to insert an additional segmented joint assembly 962 into the arm 803.

The invention uses the segmented joint assemblies described above with reference to FIGS. 8 through 16 in accordance with the following method. First, a ball joint assembly of the type illustrated in either FIG. 12 or 13 is selected in accordance with the particular surface coil to be employed. The surface coil is attached to the ball joint assembly using the hook and loop fasteners and the ball joint assembly is screwed onto one end of the segmented joint arm 802. Then, the arm is inserted into the base 400, with the patient resting his head on the base 400 in the manner illustrated in FIG. 8. The arm 802 is then flexed and the ball joint holding the surface coil is rotated as the surface coil is manually brought into the desired position for an MRI scan. Following the MRI scan, any one of the foregoing steps may be repeated to either change the surface coil position or to exchange the present surface coil for a different one.

Preferably, the surface coil support apparatus of the invention is covered with a soft coating. Referring to the cross-sectional view of FIG. 10, the segmented joint arm 802 is covered with a layer of foam 980. The foam-covered arm is then dipped in vinyl to place an outer vinyl layer 982 over the entire surface of the foam. Referring to FIG. 11, the portable base 400 includes a plastic substrate 984 covered by a foam layer 986 which has been dipped in vinyl to deposit an outer vinyl layer 988 covering the entire portable base 400.

While the invention has been described in detail by specific reference to preferred embodiments thereof, it is understood that variations and modifications thereof may be made without departing from the true spirit and scope of the invention.

What is claimed is:

1. In a magnetic resonance imagining system, a coil assembly comprising a surface coil, a portable base and support means for permitting said coil to be translated along any one of three orthogonal directions and to be rotated about any one of three orthogonal axes with respect to said base upon the application of a force, and for arresting the position of said coil upon removal of said force, said support means being a segmented joint assembly comprising a plurality of non-metallic, tubular segmented joint members connected together end-to-end, whereby said segmented joint assembly has a tubular interior extending along its length, each of said segmented joint members having a hollow skirt portion and a ball portion removably held in the skirt portion of an adjacent one of said segmented joint members, a powder filling said tubular interior for increasing the resistance between the ball and skirt portions of adjacent segmented joint members, whereby to increase the force required to move said ball portions with respect to said skirt portions.

* * * * *